United States Patent
Mori et al.

(10) Patent No.: US 11,901,879 B2
(45) Date of Patent: Feb. 13, 2024

(54) MULTIPLEXER, RADIO-FREQUENCY FRONT END CIRCUIT, AND COMMUNICATION DEVICE

(71) Applicant: Murata Manufacturing Co., Ltd., Kyoto (JP)

(72) Inventors: Hirotsugu Mori, Kyoto (JP); Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 590 days.

(21) Appl. No.: 17/117,587

(22) Filed: Dec. 10, 2020

(65) Prior Publication Data

US 2022/0302899 A1    Sep. 22, 2022

Related U.S. Application Data

(63) Continuation of application No. PCT/JP2019/022510, filed on Jun. 6, 2019.

(30) Foreign Application Priority Data

Jun. 28, 2018  (JP) ................................ 2018-123081

(51) Int. Cl.
*H03H 9/64* (2006.01)
*H03H 9/25* (2006.01)
(Continued)

(52) U.S. Cl.
CPC ............ *H03H 9/6483* (2013.01); *H03H 9/25* (2013.01); *H03H 9/725* (2013.01); *H04B 1/0057* (2013.01)

(58) Field of Classification Search
CPC ........ H03H 9/6483; H03H 9/25; H03H 9/725; H04B 1/0057
See application file for complete search history.

(56) References Cited

U.S. PATENT DOCUMENTS

| | | | |
|---|---|---|---|
| 2007/0046395 A1 | 3/2007 | Tsutsumi et al. | |
| 2008/0042778 A1* | 2/2008 | Jamneala | H03H 9/0004 333/133 |

(Continued)

FOREIGN PATENT DOCUMENTS

| | | |
|---|---|---|
| JP | 2007-060411 A | 3/2007 |
| JP | 2018-098691 A | 6/2018 |
| WO | 2017/217197 A1 | 12/2017 |

OTHER PUBLICATIONS

International Search Report for PCT/JP2019/022510 dated Aug. 20, 2019.
Written Opinion for PCT/JP2019/022510 dated Aug. 20, 2019.

*Primary Examiner* — Samuel S Outten
(74) *Attorney, Agent, or Firm* — Pearne & Gordon LLP

(57) ABSTRACT

A multiplexer (1) includes: a filter (13L) that is arranged between a common terminal (100) and an input/output terminal (130) and that has a first pass band; a filter (12H) that is arranged between the common terminal (100) and an input/output terminal (120), that is formed of at least one acoustic wave resonator, and that has a second pass band located at a higher frequency than the first pass band; and a capacitor (C2) that is serially arranged on a connection path between the common terminal (100) and the filter (12H). When the filter (12H) is regarded as a capacitance, the Q value of the capacitor (C2) in the first pass band is higher than the Q value of the capacitance in the first pass band.

18 Claims, 10 Drawing Sheets

(51) Int. Cl.
*H03H 9/72* (2006.01)
*H04B 1/00* (2006.01)

(56) References Cited

U.S. PATENT DOCUMENTS

| | | | | |
|---|---|---|---|---|
| 2011/0128092 A1* | 6/2011 | Fritz | ......................... | H04B 1/52 |
| | | | | 333/133 |
| 2015/0341016 A1* | 11/2015 | Iwaki | ................. | H03H 9/02228 |
| | | | | 333/133 |
| 2017/0093374 A1* | 3/2017 | Yatsenko | ............... | H03H 9/706 |
| 2017/0324394 A1* | 11/2017 | Ebner | ................ | H03H 9/02992 |
| 2019/0123722 A1 | 4/2019 | Nosaka | | |

* cited by examiner

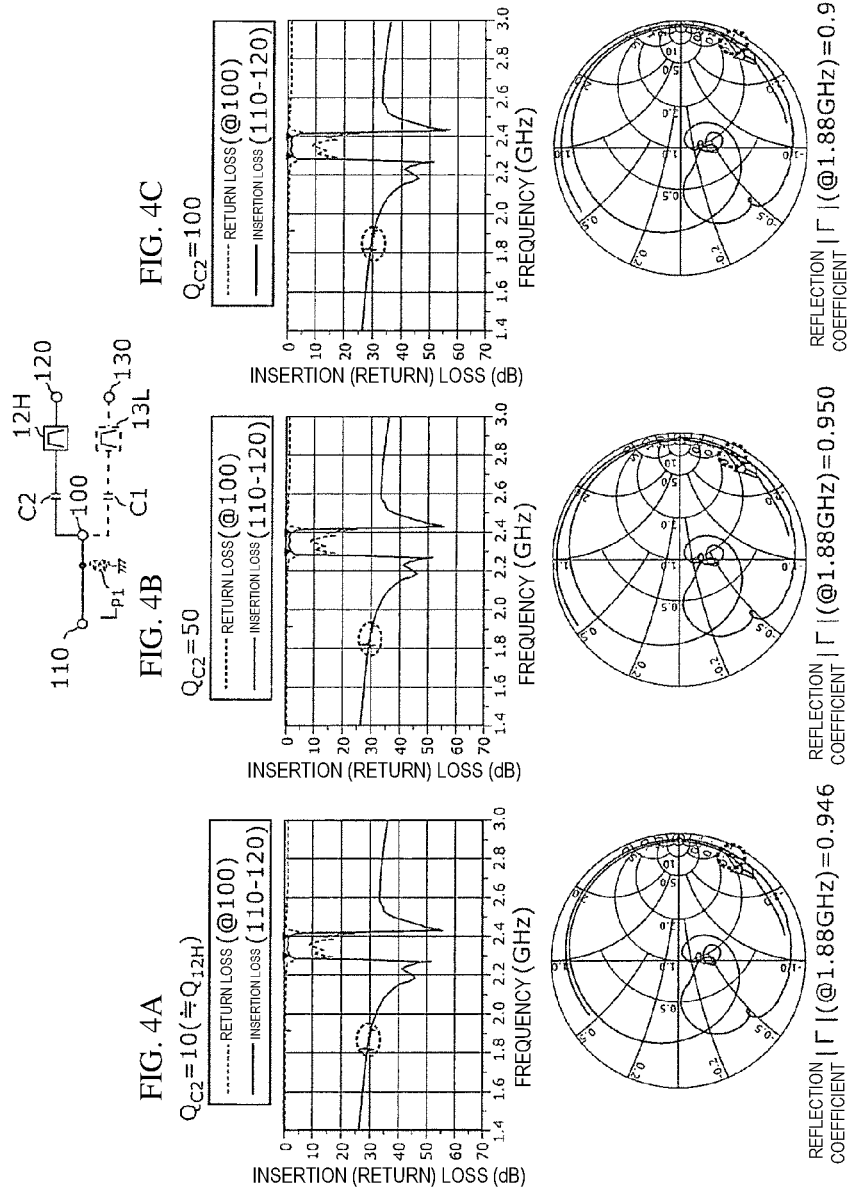

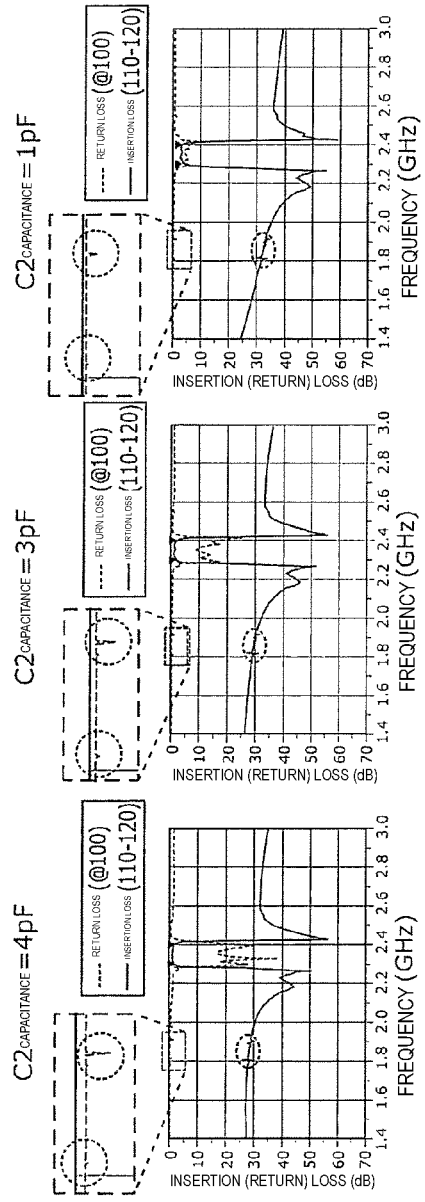
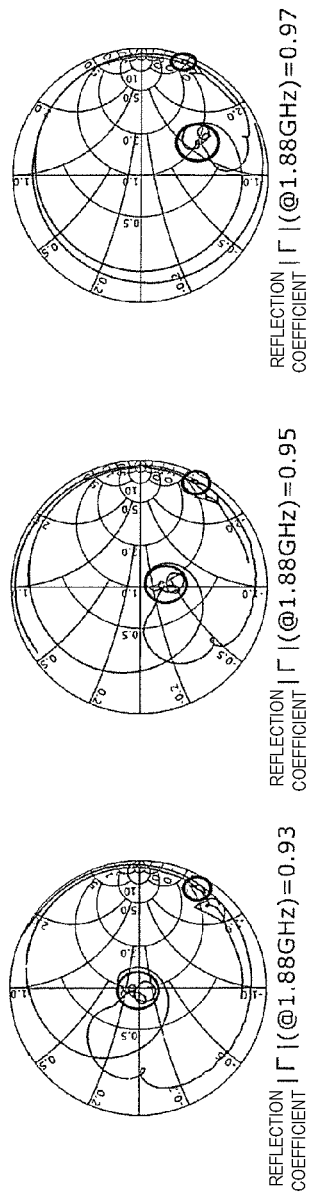
FIG. 6A    FIG. 6B    FIG. 6C

EXAMPLE 1

Band3Rx<Band1Rx<Band40

Band3Rx<Band40<Band42

MULTIPLEXER, RADIO-FREQUENCY FRONT END CIRCUIT, AND COMMUNICATION DEVICE

CROSS REFERENCE TO RELATED APPLICATION

This is a continuation of International Application No. PCT/JP2019/022510 filed on Jun. 6, 2019 which claims priority from Japanese Patent Application No. 2018-123081 filed on Jun. 28, 2018. The contents of these applications are incorporated herein by reference in their entireties.

BACKGROUND OF THE DISCLOSURE

Field of the Disclosure

The present disclosure relates to a multiplexer that includes acoustic wave filters, to a radio-frequency front end circuit, and to a communication device.

Description of the Related Art

For recent cellular phones, there has been a demand for a plurality of frequency bands and a plurality of wireless systems, so-called multiple bands and multiple modes, to be handled by a single cellular phone terminal. In order to realize this demand, a multiplexer that splits a radio-frequency signal of a plurality of communication bands is arranged immediately below a single antenna. Acoustic wave filters having low loss inside the pass bands thereof, which respectively correspond to the respective communication bands, and steep bandpass characteristics around the peripheries of the pass bands are used as the plurality of filters constituting such a multiplexer.

Patent Document 1 discloses a splitter having a configuration in which a first filter (low-frequency side) and a second filter (high-frequency side) consisting of surface acoustic wave resonators are connected to a resonance terminal (common terminal). The splitter further includes a capacitor that is connected between the resonance terminal and at least one out of the first filter and the second filter. This capacitor makes it possible to independently match the impedance in the passband of the first filter and in the passband of the second filter when the two filters are viewed from the resonance terminal with the first filter and the second filter commonly connected to the resonance terminal.
Patent Document 1: Japanese Unexamined Patent Application Publication No. 2007-60411

BRIEF SUMMARY OF THE DISCLOSURE

However, in the splitter disclosed in Patent Document 1, spurious is generated in the second filter (high-frequency side) by a mode of acoustic waves propagating along, for example, a piezoelectric substrate at a lower frequency than the pass band of the second filter. When the frequency at which this spurious is generated overlaps the pass band of the first filter (low-frequency side), the insertion loss of the first filter (low-frequency side) is degraded.

Accordingly, the present disclosure was made in order to solve this problem and it is an object of the present disclosure to provide a multiplexer in which the insertion loss inside the pass band of each acoustic wave filter connected to a common terminal is reduced.

In order to achieve the above-described object, an aspect of the present disclosure provides a multiplexer having a common terminal, a first input/output terminal, and a second input/output terminal, and a plurality of filters connected to the common terminal. The multiplexer includes: a first filter that is arranged between the common terminal and the first input/output terminal and that has a first pass band; a second filter that is arranged between the common terminal and the second input/output terminal, that is formed of at least one acoustic wave resonator, and that has a second pass band located at a higher frequency than the first pass band; and a second capacitor that is serially arranged on a connection path between the common terminal and the second filter. When the second filter is regarded as a capacitance, a Q value of the second capacitor in the first pass band is higher than a Q value of the capacitance in the first pass band.

According to a multiplexer, a radio-frequency front end circuit, or a communication device of the present disclosure, the insertion loss inside the pass bands of acoustic wave filters connected to a common terminal can be reduced.

BRIEF DESCRIPTION OF THE SEVERAL VIEWS OF THE DRAWINGS

FIGS. 4A, 4B and 4C depict graphs illustrating the bandpass characteristic and reflection characteristic of a second filter and Smith charts illustrating the impedance of the second filter when the Q value of the second capacitor in the multiplexer is varied.

FIGS. 6A, 6B and 6C depict graphs illustrating the bandpass characteristic and reflection characteristic of a second filter and Smith charts illustrating the impedance of the second filter when the capacitance of the second capacitor in the multiplexer is varied.

DETAILED DESCRIPTION OF THE DISCLOSURE

Figure 1:
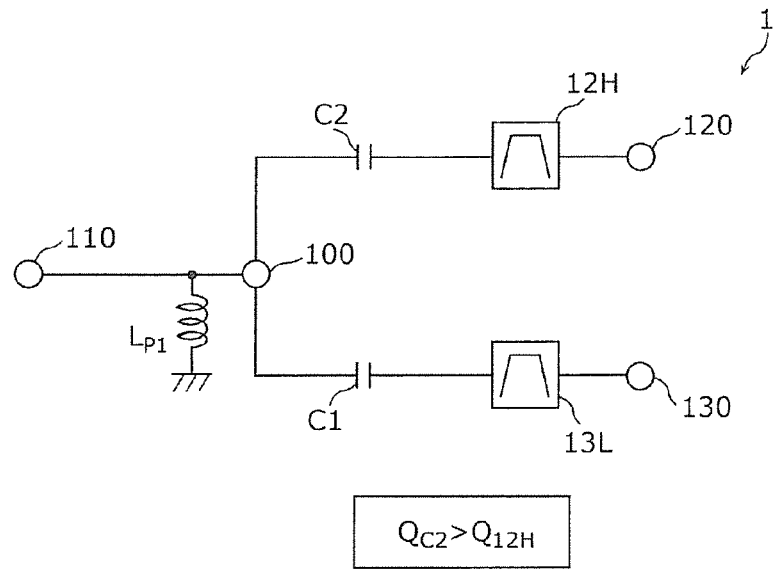
FIG. 1 is a circuit configuration diagram of a multiplexer according to embodiment 1.

Hereafter, embodiments of the present disclosure will be described in detail using the drawings. The embodiments described hereafter each illustrate a comprehensive or specific example of the present disclosure. The numerical values, shapes, materials, constituent elements, arrangement of the constituent elements, the ways in which the constituent elements are connected to each other and so forth given in the following embodiments are merely examples and are not intended to limit the present disclosure. Constituent elements not described in the independent claims among constituent elements in the following embodiments are described as arbitrary constituent elements. In addition, the sizes or size ratios between the constituent elements illustrated in the drawings are not necessarily strictly accurate.

Embodiment 1

1.1 Circuit Configuration of Multiplexer

FIG. 1 is a circuit configuration diagram of a multiplexer 1 according to embodiment 1. As illustrated in the figure, the multiplexer 1 includes filters 13L and 12H, capacitors C1 and C2, an inductor $L_{P1}$, common terminals 100 and 110, and input/output terminals 120 and 130. The multiplexer 1 is an acoustic wave filter device that includes the filters 13L and 12H, which are connected to the common terminal 100.

For example, the common terminal 110 can be connected to an antenna element, and the input/output terminals 120 and 130 can be connected to a radio-frequency signal processing circuit via an amplification circuit.

The filter 13L is a first filter that is arranged between the common terminal 100 and the input/output terminal 130 (first input/output terminal) and has a first pass band (center frequency $f0_{13L}$). The filter 13L is, for example, formed of one or more acoustic wave resonators, and the acoustic wave resonators are, for example, surface acoustic wave (SAW) resonators.

The filter 12H is a second filter that is arranged between the common terminal 100 and the input/output terminal 120 (second input/output terminal) and has a second pass band (center frequency $f0_{12H}$ ($>f0_{13L}$)) located at a higher frequency than the first pass band. The filter 12H is formed of one or more acoustic wave resonators, and the acoustic wave resonators are, for example, SAW resonators. The SAW resonators of the filter 12H utilize leaky waves using a $LiTaO_3$ substrate or Love waves using a $LiNbO_3$ substrate. Alternatively, the SAW resonators of the filter 12H each include a structure in which a high-acoustic-velocity support substrate, a low-acoustic-velocity film, and a piezoelectric layer are stacked on top of one another (acoustic velocity film multilayer structure) and interdigital transducer (IDT) electrodes formed on the acoustic velocity film multilayer structure.

In this embodiment, the acoustic wave resonators of the filters 13L and 12H are all SAW resonators, but the resonators may instead be acoustic wave resonators that utilize boundary acoustic waves or bulk acoustic waves (BAWs). In addition, the filters 13L and 12H do not have to have a ladder structure. In addition, the filter 13L may have a configuration that does not include an acoustic wave resonator such as an LC resonance circuit.

The capacitor C1 is a first capacitor that is serially arranged along a path connecting the common terminal 100 and the filter 13L to each other. The capacitor C2 is a second capacitor that is serially arranged along a path connecting the common terminal 100 and the filter 12H to each other. The inductor $L_{P1}$ is connected between ground and a path connecting the common terminals 110 and 100 to each other. In this way, impedance matching can be secured between the antenna element and each filter.

In this case, when the filter 12H is regarded as a capacitance, the Q value of the capacitor C2 in the first pass band is higher than the Q value of the capacitance in the first pass band.

It is known that spurious due to Rayleigh waves is generated at a frequency in the vicinity of 0.76 times the resonant frequency in an acoustic wave resonator utilizing leaky waves using a $LiTaO_3$ substrate or the like or in an acoustic wave resonator having a structure in which a high-acoustic-velocity support substrate, a low-acoustic-velocity film, and a piezoelectric layer are stacked on top of one another (acoustic velocity film multilayer structure). In other words, in a radio-frequency filter formed of such acoustic wave resonators, the loss caused by such spurious is generated in an attenuation band at a lower frequency than the center frequency. This loss due to spurious has little effect on the attenuation of the radio-frequency filter, but reduces the reflection coefficient ($|\Gamma|$) in the attenuation band. On the other hand, radio-frequency filters formed of acoustic wave resonators each have a capacitive characteristic and function as a capacitor in the attenuation band, and therefore each function as a capacitor having a low Q value in the frequency band where the spurious is generated. Therefore, in the case of a multiplexer including a plurality of filters that are connected to a common terminal, the spurious of the higher-frequency-side filter having a higher pass band (second pass band) causes an increase in the insertion loss inside the pass band of the lower-frequency-side filter having a pass band (first pass band) located at a frequency where the spurious is generated.

With respect to this, according to the above-described configuration of the multiplexer 1 in accordance with embodiment 1, the capacitor C2, which has a higher Q value than the Q value of the capacitance of the filter 12H in the first pass band, is inserted between the filter 12H and the common terminal 100. Therefore, the Q value of the capacitance of the filter 12H in the first pass band can be increased on the common terminal 100 side of the filter 12H. Thus, the reflection coefficient ($|\Gamma|$) of the filter 12H in the first pass band can be increased (return loss can be reduced) and therefore insertion loss in the first pass band of the filter 13L, which is connected to the common terminal 100 together with the filter 12H, can be improved. In addition, propagation loss of a radio-frequency signal can be reduced without arranging a splitting/combining device, a phase adjusting circuit, or the like in a stage prior to the filters, and reductions in size and cost can be realized.

Note that in the multiplexer 1 according to this embodiment, the capacitor C1 and the inductor $L_{P1}$ are not essential components and may be omitted.

1.2 Configurations of Acoustic Wave Filters

Next, examples of the circuit configurations of the filters 13L and 12H of the multiplexer 1 will be described.

Figure 2A:
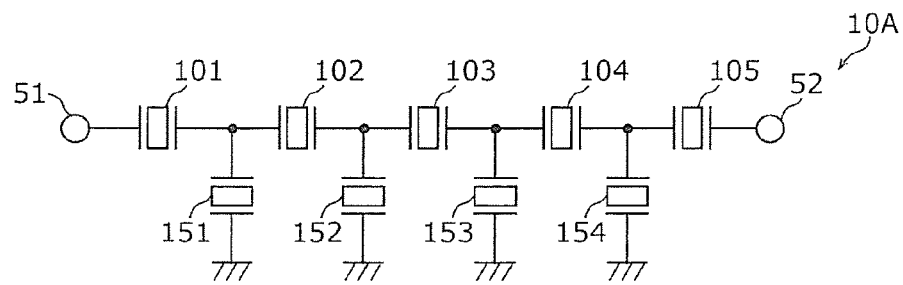
FIG. 2A is a diagram illustrating a first example of the circuit configuration of an acoustic wave filter of the multiplexer according to embodiment 1.
Figure 2B:
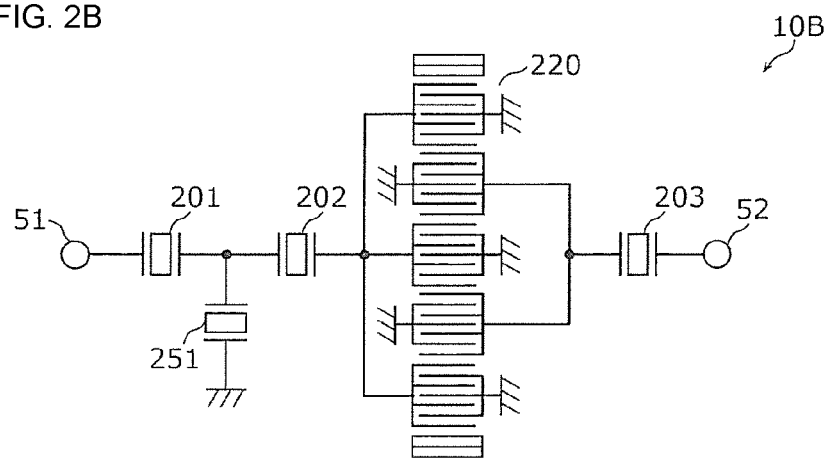
FIG. 2B is a diagram illustrating a second example of the circuit configuration of an acoustic wave filter of the multiplexer according to embodiment 1.

FIG. 2A is a diagram illustrating a first example of the circuit configuration of an acoustic wave filter of the multiplexer 1 according to embodiment 1. FIG. 2B is a diagram illustrating a second example of the circuit configuration of an acoustic wave filter of the multiplexer 1 according to embodiment 1.

The filters 13L and 12H of the multiplexer 1 according to this embodiment, for example, each have the circuit configuration of an acoustic wave filter 10A illustrated in FIG. 2A or an acoustic wave filter 10B illustrated in FIG. 2B.

The acoustic wave filter 10A illustrated in FIG. 2A includes series arm resonators 101 to 105 and parallel arm resonators 151 to 154.

The series arm resonators 101 to 105 are serially arranged along a path connecting an input/output terminal 51 and an input/output terminal 52 to each other. In addition, the parallel arm resonators 151 to 154 are connected between ground and connection points between the series arm resonators 101 to 105 and the input/output terminals 51 and 52. With this connection configuration, the acoustic wave filter 10A is configured as a ladder band pass filter. When the acoustic wave filter 10A is applied to either one of the filters 13L and 12H, the input/output terminal 51 is connected to either one of the capacitors C1 and C2, and the input/output terminal 52 is connected to either one of the input/output terminals 120 and 130. In the acoustic wave filter 10A, the number of series arm resonators and parallel arm resonators is arbitrary, and an inductor may be arranged between each parallel arm resonator and ground.

The acoustic wave filter 10B illustrated in FIG. 2B includes a longitudinal-coupling-type filter section 220, series arm resonators 201, 202, and 203, and a parallel arm resonator 251.

The longitudinal-coupling-type filter section 220, for example, includes nine IDTs, and the nine IDTs are each formed of a pair of IDT electrodes that face each other. The series arm resonators 201, 202, and 203 and the parallel arm resonator 251 form a ladder filter section. With this configuration, the acoustic wave filter 10B forms a band pass filter. When the acoustic wave filter 10B is applied to either one of the filters 13L and 12H, the input/output terminal 51 is connected to either one of the capacitors C1 and C2, and the input/output terminal 52 is connected to either one of the input/output terminals 120 and 130. Note that, in the acoustic wave filter 10B, the number of series arm resonators and parallel arm resonators and the number of IDTs forming the longitudinal-coupling-type filter section 220 are arbitrary.

1.3 Operational Effect of Q Value of Capacitance in Multiplexer According to Embodiment 1

Figure 3B:
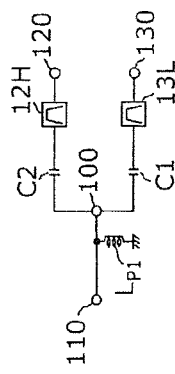
FIGS. 3A, 3B and 3C depict graphs illustrating changes that occur in the bandpass characteristics when the Q value of a second capacitor of the multiplexer is varied.
Figure 3A:
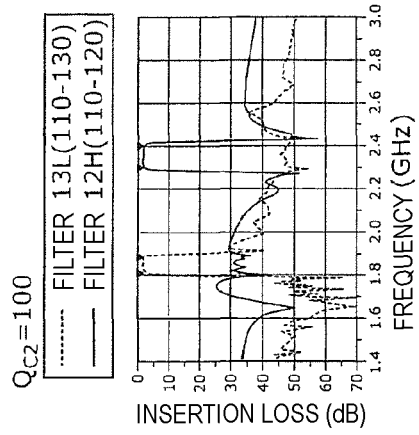
Figure 3B:
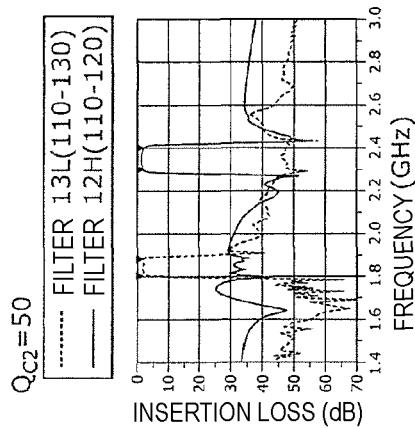
Figure 3C:
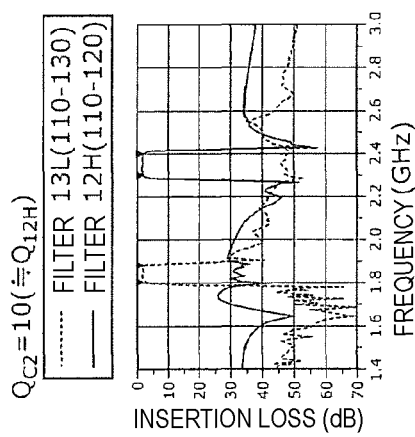

FIGS. 3A, 3B and 3C depict graphs illustrating changes that occur in the bandpass characteristics when the Q value of the capacitor C2 of the multiplexer is varied. FIG. 3A illustrates the bandpass characteristic of the filter 13L (between common terminal 110 and input/output terminal 130) and the bandpass characteristic of the filter 12H (between common terminal 110 and input/output terminal 120) when the Q value ($Q_{C2}$) of the capacitance of the capacitor C2 in the first pass band is 10. In addition, FIG. 3B illustrates the bandpass characteristic of the filter 13L and the bandpass characteristic of the filter 12H when the Q value ($Q_{C2}$) of the capacitance of the capacitor C2 in the first pass band is 50. Furthermore, FIG. 3C illustrates the bandpass characteristic of the filter 13L and the bandpass characteristic of the filter 12H when the Q value ($Q_{C2}$) of the capacitance of the capacitor C2 in the first pass band is 100. In FIGS. 3A to 3C, when the filter 12H is regarded as a capacitance, the Q value ($Q_{12H}$) of this capacitance in the first pass band is 10.

In addition, the reception band (1805-1880 MHz) of Band 3 of Long Term Evolution (LTE) is used as the first passband of the filter 13L, and the transmission/reception band (2300-2400 MHz) of Band 40 of LTE is used as the second passband of the filter 12H.

As illustrated in FIGS. 3A, 3B and 3C, the insertion loss inside the pass band of the filter 13L decreases as the Q value ($Q_{C2}$) of the capacitance of the capacitor C2 increases as 10, 50, and 100. In particular, the insertion loss inside the pass band of the filter 13L is smaller than 2.5 dB and the multiplexer 1 having low loss is realized when the Q value ($Q_{C2}$) of the capacitance of the capacitor C2 is larger than the Q value ($Q_{12H}$) of the filter 12H (FIGS. 3B and 3C).

FIGS. 4A, 4B and 4C depict graphs illustrating the bandpass characteristic and reflection characteristic of the filter 12H and Smith charts illustrating the impedance of the filter 12H when the Q value of the capacitor C2 in the multiplexer is varied. FIG. 4A illustrates the bandpass characteristic and the reflection characteristic of the filter 12H as a standalone unit (the upper part of FIG. 4A) and the impedance of the filter 12H as a standalone unit viewed from the common terminal 100 (the lower part of FIG. 4A) when the Q value ($Q_{C2}$) of the capacitance of the capacitor C2 is 10. In addition, FIG. 4B illustrates the bandpass characteristic and the reflection characteristic of the filter 12H as a standalone unit (the upper part of FIG. 4B) and the impedance of the filter 12H as a standalone unit viewed from the common terminal 100 (the lower part of FIG. 4B) when the Q value ($Q_{C2}$) of the capacitance of the capacitor C2 is 50. Furthermore, FIG. 4C illustrates the bandpass characteristic and the reflection characteristic of the filter 12H as a standalone unit (the upper part of FIG. 4C) and the impedance of the filter 12H as a standalone unit viewed from the common terminal 100 (the lower part of FIG. 4C) when the Q value ($Q_{C2}$) of the capacitance of the capacitor C2 is 100. In FIGS. 4A to 4C, when the filter 12H is regarded as a capacitance, the Q value ($Q_{12H}$) of this capacitance in the first pass band is 10, as with FIGS. 3A to 3C.

In addition, the reception band of Band 3 of LTE is used as the first passband of the filter 13L and the transmission/reception band of Band 40 of LTE is used as the second passband of the filter 12H.

As illustrated in the upper part of FIGS. 4A, 4B and 4C, in the bandpass characteristic (and reflection characteristic) of the filter 12H, an attenuation inflection point (area surrounded by broken line in figure) caused by spurious appears at a lower frequency than the pass band (inside the first pass band). This spurious is Rayleigh wave spurious that appears in the vicinity of a frequency that is 0.76 times the resonant frequency of the acoustic wave resonators, for example, when the filter 12H is an acoustic wave filter utilizing leaky waves using a LiTaO$_3$ substrate or the like or when the filter 12H is formed of acoustic wave resonators having a structure in which a high-acoustic-velocity support substrate, a low-acoustic-velocity film, and a piezoelectric layer are stacked (acoustic velocity film multilayer structure).

On the other hand, as illustrated in the lower part of FIGS. 4A, 4B and 4C, in the impedance characteristic of the filter 12H as well, an impedance inflection point appears (the area enclosed by the broken line in the figure) that corresponds to the above spurious generated inside the first passband. However, the reflection coefficient (|Γ|) inside the first pass band (1880 GHz) increases as the Q value ($Q_{C2}$) of the capacitance of the capacitor C2 in the first pass band increases as 10, 50, and 100. This is due to the Q value of the capacitance of the filter 12H in the first passband at the common terminal 100 side increasing as the Q value ($Q_{C2}$) of the capacitance of the capacitor C2 increases.

Figure 5A:
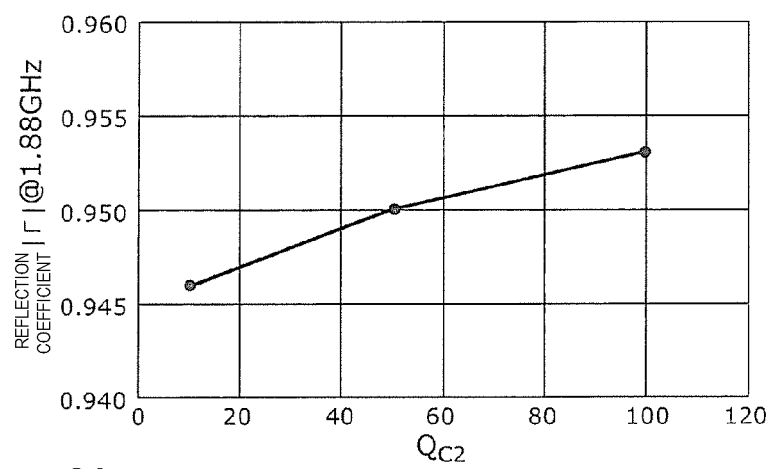
FIGS. 5A and 5B depict graphs illustrating the relationship between the Q value of the second capacitor and the reflection coefficient of the second filter and the relationship between the Q value of the second capacitor and the insertion loss of the first filter in the multiplexer.
Figure 5B:
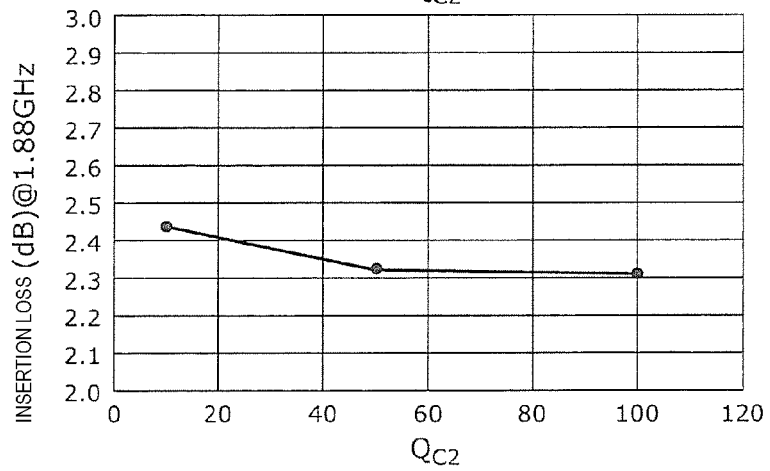

FIGS. 5A and 5B depict graphs illustrating the relationship between the Q value of the capacitor C2 and the reflection coefficient of the filter 12H and the relationship between the Q value of the capacitor C2 and the insertion loss of the filter 13L in the multiplexer. FIGS. 5A and 5B summarize the results of FIGS. 3A, 3B and 3C and 4A, 4B and 4C. FIG. 5A illustrates the relationship between the Q value ($Q_{C2}$) of the capacitance of the capacitor C2 and the reflection coefficient ($|\Gamma|$) inside the first pass band (1880 GHz) when the filter 12H is viewed as a standalone unit from the common terminal 100. FIG. 5B illustrates the relationship between the Q value ($Q_{C2}$) of the capacitance of the capacitor C2 and the insertion loss in the first pass band (1880 GHz) of the filter 13L.

From FIGS. 5A and 5B, as the Q value ($Q_{C2}$) of the capacitance of the capacitor C2 increases, the reflection coefficient $|\Gamma|$ inside the first passband (1880 GHz) when looking at filter 12H as a standalone unit from common terminal 100 increases and the insertion loss in the first pass band of filter 13L decreases.

As described above, regarding the relationships between the Q value ($Q_{C2}$) of the capacitance of the capacitor C2 and the reflection coefficient ($|\Gamma|$) of the filter 12H and the insertion loss of the filter 13L, in the multiplexer 1 according to this embodiment, the Q value ($Q_{C2}$) of the capacitance of the capacitor C2 is larger than the Q value ($Q_{12H}$) of the capacitance of the filter 12H, as illustrated in FIGS. 3B and 3C and FIGS. 4B and 4C. Thus, the insertion loss inside the pass bands of the filters 13L and 12H can be reduced and the low-loss multiplexer 1 can be realized.

1.4 Operational Effect of Capacitance in Multiplexer According to Embodiment 1

It has been described that it is necessary for the Q value ($Q_{C2}$) of the capacitance of the capacitor C2 to be greater than or equal to the Q value ($Q_{12H}$) of the capacitance of the filter 12H in order to secure low loss in the multiplexer 1 according to this embodiment. In addition to this, it will be described that the capacitance ($C_{C2}$) of the capacitor C2 is preferably set to be less than or equal to 3 pF in the multiplexer 1 according to this embodiment in order to realize lower loss.

FIGS. 6A, 6B and 6C depict graphs illustrating the bandpass characteristic and reflection characteristic of the filter 12H and Smith charts illustrating the impedance of the filter 12H when the capacitance of the capacitor C2 in the multiplexer is varied. FIG. 6A illustrates the bandpass characteristic and the reflection characteristic of the filter 12H as a standalone unit (the upper part of FIG. 6A) and the impedance of the filter 12H as a standalone unit viewed from the common terminal 100 (the lower part of FIG. 6A) when the capacitance ($C_{C2}$) of the capacitor C2 is 4 pF. In addition, FIG. 6B illustrates the bandpass characteristic and the reflection characteristic of the filter 12H as a standalone unit (the upper part of FIG. 6B) and the impedance of the filter 12H as a standalone unit viewed from the common terminal 100 (the lower part of FIG. 6B) when the capacitance ($C_{C2}$) of the capacitor C2 is 3 pF. Furthermore, FIG. 6C illustrates the bandpass characteristic and the reflection characteristic of the filter 12H as a standalone unit (the upper part of FIG. 6C) and the impedance of the filter 12H as a standalone unit viewed from the common terminal 100 (the lower part of FIG. 6C) when the capacitance ($C_{C2}$) of the capacitor C2 is 1 pF. In FIGS. 6A to 6C, the Q value ($Q_{C2}$) of the capacitance of the capacitor C2 is 100 and when the filter 12H is regarded as a capacitance, the Q value ($Q_{12H}$) of this capacitance in the first pass band is 10. In other words, it is assumed that the Q value ($Q_{C2}$) of the capacitance of the capacitor C2 is larger than the Q value ($Q_{12H}$) of the capacitance of the filter 12H.

In addition, the reception band of Band 3 of LTE is used as the first passband of the filter 13L, and the transmission/reception band of Band 40 of LTE is used as the second passband of the filter 12H.

As illustrated in the upper part of FIGS. 6A, 6B and 6C, in the bandpass characteristic (and reflection characteristic) of the filter 12H, an attenuation inflection point (area surrounded by broken line in figure) caused by spurious appears at a lower frequency than the pass band (inside the first pass band). This spurious is Rayleigh wave spurious that appears in the vicinity of a frequency that is 0.76 times the resonant frequency of acoustic wave resonators, for example, when the filter 12H is an acoustic wave filter utilizing leaky waves using a $LiTaO_3$ substrate or the like or when the filter 12H is formed of an acoustic wave resonator having a structure in which a high-acoustic-velocity support substrate, a low-acoustic-velocity film, and a piezoelectric layer are stacked (acoustic velocity film multilayer structure).

On the other hand, as illustrated in the lower part of FIGS. 6A, 6B and 6C, in the impedance characteristic of the filter 12H as well, an impedance inflection point appears (the area enclosed by the broken line in the figure) that corresponds to the above spurious generated inside the first passband. However, the reflection coefficient ($|\Gamma|$) inside the first pass band (1880 GHz) increases as the capacitance ($C_{C2}$) of the capacitor C2 in the first pass band decreases as 4 pF, 3 pF, and 1 pF.

From FIGS. 6A, 6B and 6C, as the capacitance ($C_{C2}$) of the capacitor C2 decreases, the reflection coefficient F inside the first passband (1880 GHz) when looking at filter 12H as a standalone unit from common terminal 100 increases and the insertion loss in the first pass band of filter 13L decreases.

1.5 Configurations of Second Filter and Second Capacitor

Next, the structures of the filter 12H and the capacitor C2 according to embodiment 1 will be described.

Figure 7A:
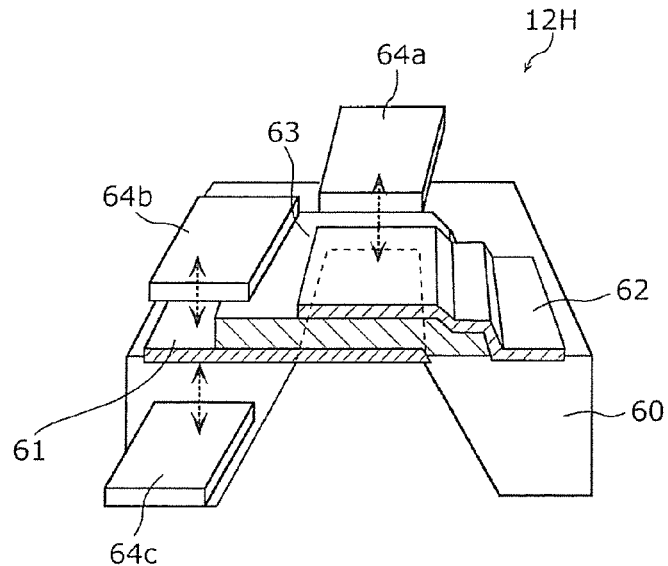
FIG. 7A is a schematic perspective view illustrating a first example of the structures of the second filter and the second capacitor according to embodiment 1.

FIG. 7A is a schematic perspective view illustrating a first example of the structures of the filter 12H and the capacitor C2 according to embodiment 1. As illustrated in the figure, the filter 12H, for example, consists of an acoustic wave resonator using BAWs, and includes a Si substrate 60, a lower electrode 61, an upper electrode 62, and a piezoelectric thin film 63. In this example, the acoustic wave resonator forming the filter 12H is a film bulk acoustic resonator (FBAR) using a piezoelectric thin film. The filter 12H has a structure in which the lower electrode 61, the piezoelectric thin film 63, and the upper electrode 62 are stacked on the Si substrate 60, which has a cavity structure formed by a cavity. With this structure, bulk acoustic waves in the stacking direction are generated that are excited between the lower electrode 61 and the upper electrode 62.

The capacitor C2 in this example is formed of the upper electrode 62, a capacitive electrode 64a, and a dielectric (not illustrated in FIG. 7A) formed between the upper electrode 62 and the capacitive electrode 64a with the capacitive electrode 64a being arranged so as to face the upper electrode 62. Alternatively, the capacitor C2 is formed of the lower electrode 61, a capacitive electrode 64b or 64c, and a dielectric (not illustrated in FIG. 7A) formed between the lower electrode 61 and the capacitive electrode 64b or 64c with the capacitive electrode 64b or 64c being arranged so as to face the lower electrode 61.

Figure 7B:
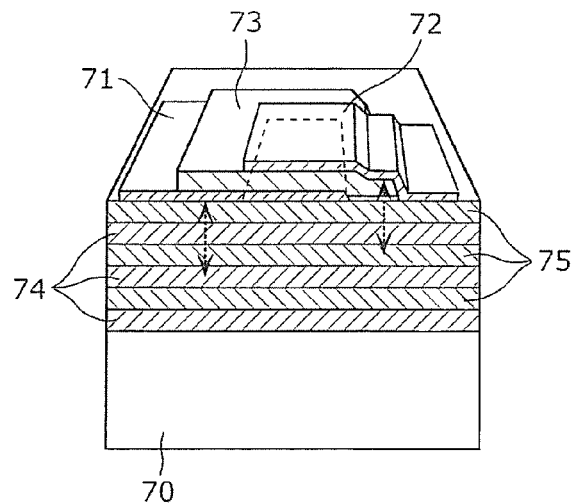
FIG. 7B is a schematic perspective view illustrating a second example of the structures of the second filter and the second capacitor according to embodiment 1.

FIG. 7B is a schematic perspective view illustrating a second example of the structures of the filter 12H and the capacitor C2 according to embodiment 1. As illustrated in the figure, the filter 12H, for example, consists of an acoustic wave resonator using BAWs, and includes a Si substrate 70, a lower electrode 71, an upper electrode 72, a piezoelectric thin film 73, a high acoustic impedance film 74, and a low acoustic impedance film 75. In this example, the acoustic wave resonator forming the filter 12H is an FBAR. In the filter 12H of this example, bulk acoustic waves are confined above an acoustic multilayer film by utilizing Bragg reflections generated by an acoustic multilayer film consisting of the high acoustic impedance film 74 and the low acoustic impedance film 75 arranged between the Si substrate 70 and the BAW resonator.

The capacitor C2 in this example is formed of the lower electrode 71 and an acoustic multilayer film electrode layer. Alternatively, the capacitor C2 is formed of the upper electrode 72 and an acoustic multilayer film electrode layer.

Figure 7C:
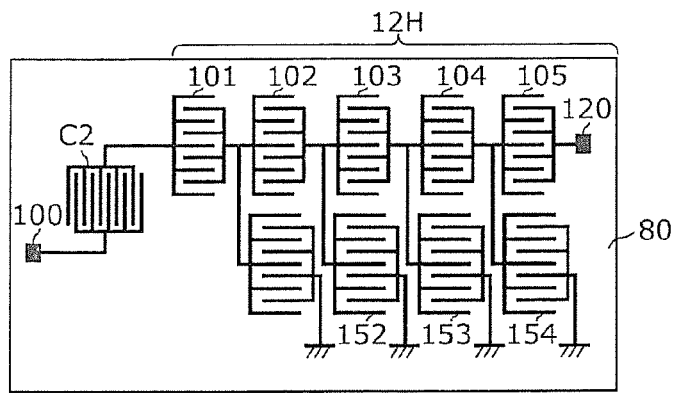
FIG. 7C is a plan view illustrating a third example of the structures of the second filter and the second capacitor according to embodiment 1.

FIG. 7C is a plan view illustrating a third example of the structures of the filter 12H and the capacitor C2 according to embodiment 1. As illustrated in the figure, the filter 12H, for example, consists of acoustic wave resonators using SAWs, and the filter 12H and the capacitor C2 are formed on a substrate 80. The IDT electrodes constituting the series arm resonators 101 to 105 and the parallel arm resonators 151 to 154 of the filter 12H are formed on the substrate 80 such that the propagation directions of the utilized acoustic waves match each other.

In addition, the capacitor C2 is formed on the substrate 80 using comb-shaped electrodes that face each other.

The substrate 80 is a substrate having a piezoelectric property in at least part thereof, and is for example a piezoelectric substrate, or may be formed of a piezoelectric thin film and a support substrate.

It is preferable that the direction of the plurality of electrode fingers forming the comb-shaped electrodes of the capacitor C2 formed on the substrate 80 intersect the direction of the plurality of electrode fingers forming the resonators of the filter 12H. It is more preferable that the direction of the plurality of electrode fingers forming the comb-shaped electrodes of the capacitor C2 formed on the substrate 80 be perpendicular to the direction of the plurality of electrode fingers forming the resonators of the filter 12H. This prevents the capacitor C2 from interfering with acoustic waves of the filter 12H and enables the capacitor C2 to function only as a capacitance element.

Furthermore, the capacitor C2 may be formed on a mounting substrate 90 on which the filters 12H and 13L are mounted rather than on the substrate 80.

Figure 7D:
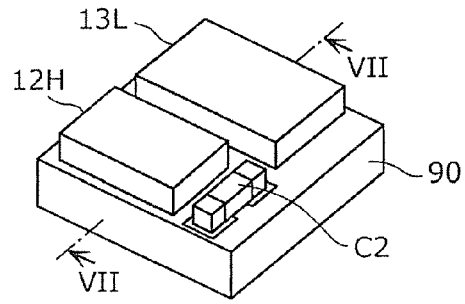
FIGS. 7D and 7E are a schematic perspective view and a sectional view illustrating the structure of the multiplexer according to embodiment 1.
Figure 7E:
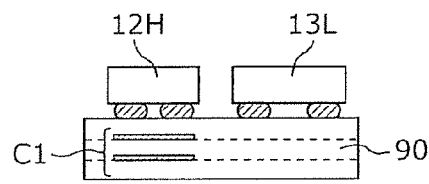

FIGS. 7D and 7E depict a schematic perspective view and a sectional view illustrating the structure of the multiplexer 1 according to embodiment 1. FIG. 7E is a sectional view taken along line VII-VII in FIG. 7D.

As illustrated in the figure, in the multiplexer 1 according to embodiment 1, for example, the filters 12H and 13L and the capacitor C2 are mounted on the mounting substrate 90.

The mounting substrate 90 is a low-temperature co-fired ceramic (LTCC) substrate, for example, having wiring lines connecting the capacitor C2 and the filters 12H and 13L to each other and built thereinto. The mounting substrate 90 may be a high-temperature co-fired ceramic (HTCC) substrate or a multilayer substrate composed of PCB.

As illustrated in FIGS. 7D and 7E, the capacitor C2 may be a chip-type capacitance element mounted on a main surface of the mounting substrate 90, and may be a multilayer ceramic capacitor (MLCC), for example.

Although the inductor $L_{P1}$ and the capacitor C1 are not illustrated in FIG. 7D, the inductor $L_{P1}$ and the capacitor C1 may respectively be a chip-type inductor and a chip-type capacitance element or may be formed of electrode patterns inside the mounting substrate 90.

According to the configuration illustrated in FIGS. 7D and 7E, since the capacitor C2 is a chip-type capacitance element mounted on the mounting substrate 90, it is possible to set the Q value of the capacitor C2 in the first pass band to be higher than the Q value of the capacitance of the filter 12H in the first pass band when the filter 12H is regarded as a capacitance. Therefore, the insertion loss inside the pass bands of the filters 13L and 12H can be reduced and the low-loss multiplexer 1 can be realized. The capacitor C2 may be formed using electrode patterns inside the mounting substrate 90 so long as the Q value of the capacitor C2 can be set to be higher than the Q value of the capacitance of the filter 12H in the first pass band when the filter 12H is regarded as a capacitance.

1.6 Multiplexers According to Examples

Hereafter, multiplexers according to examples in which the capacitance of the capacitor C2 is varied will be compared.

Figure 8:
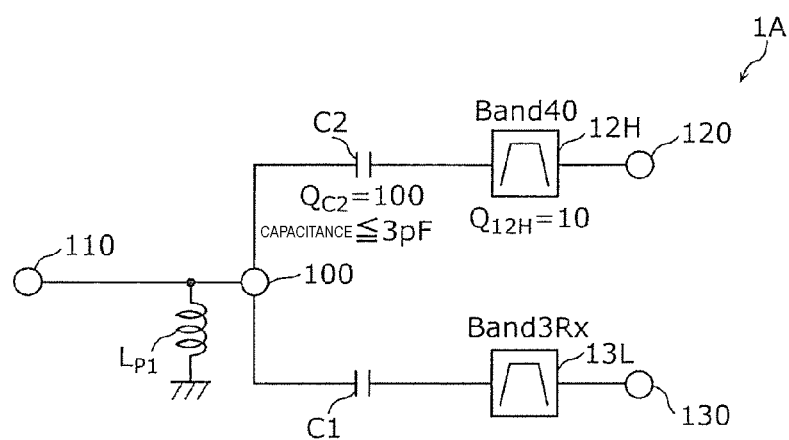
FIG. 8 is a circuit configuration diagram of a multiplexer according to example 1.

FIG. 8 is a circuit configuration diagram of a multiplexer 1A according to example 1. As illustrated in the figure, the multiplexer 1A includes filters 13L and 12H, capacitors C1 and C2, an inductor $L_{P1}$, common terminals 100 and 110, and input/output terminals 120 and 130. The multiplexer 1A according to example 1 differs from the multiplexer 1 according to embodiment 1 in that the specific numerical values of the Q value ($Q_{C2}$) of the capacitance ($C_{C2}$) of the capacitor C2 and the capacitance ($C_{C2}$) of the capacitor C2 are specified. Hereafter, the description will focus on the differences between the multiplexer 1A according to example 1 and the multiplexer 1 according to embodiment 1.

The filter 13L is a first filter that is arranged between the common terminal 100 and the input/output terminal 130 (first input/output terminal) and has a first pass band (center frequency $f0_{13L}$). The first pass band is the reception band (1805-1880 MHz) of Band 3 of LTE, for example.

The filter 12H is a second filter that is arranged between the common terminal 100 and the input/output terminal 120 (second input/output terminal) and has a second pass band (center frequency $f0_{12H}$ ($>f0_{13L}$)) located at a higher frequency than the first pass band. The second pass band is the transmission/reception band (2300-2400 MHz) of Band 40 of LTE, for example.

The capacitor C1 is a first capacitor that is serially arranged along a path connecting the common terminal 100 and the filter 13L to each other. The capacitor C2 is a second capacitor that is serially arranged along a path connecting the common terminal 100 and the filter 12H to each other. The Q value ($Q_{C2}$) of the capacitance of the capacitor C2 in the first pass band is 100. In addition, the capacitance ($C_{C2}$) of the capacitor C2 in the first pass band is less than or equal to 3 pF. In addition, when the filter 12H is regarded as a capacitance, the Q value ($Q_{12H}$) of this capacitance in the first pass band is 10.

In other words, in the multiplexer 1A according to example 1, the Q value ($Q_{C2}$) of the capacitance ($C_{C2}$) of the capacitor C2 is greater than the Q value ($Q_{12H}$) of the capacitance of the filter 12H and the capacitance ($C_{C2}$) of the capacitor C2 is less than or equal to 3 pF.

The multiplexer 1A according to example 1 described above includes a multiplexer according to example 1-1 and a multiplexer according to example 1-2.

In the multiplexer according to example 1-1, the Q value ($Q_{C2}$) of the capacitance ($C_{C2}$) of the capacitor C2 is 100, the capacitance ($C_{C2}$) of the capacitor C2 is 3.0 pF, the Q value ($Q_{12H}$) of the capacitance of the filter 12H is 10, and the capacitance of the capacitor C1 is 2.2 pF.

In the multiplexer according to example 1-2, the Q value ($Q_{C2}$) of the capacitance ($C_{C2}$) of the capacitor C2 is 100, the capacitance ($C_{C2}$) of the capacitor C2 is 1.0 pF, the Q value ($Q_{12H}$) of the capacitance of the filter 12H is 10, and the capacitance of the capacitor C1 is 1.1 pF.

In addition, a multiplexer according to example A has a circuit configuration identical to the circuit configuration illustrated in FIG. 1, but the Q value ($Q_{C2}$) of the capacitance ($C_{C2}$) of the capacitor C2 is 100, the capacitance ($C_{C2}$) of the capacitor C2 is 4.0 pF, the Q value ($Q_{12H}$) of the capacitance of the filter 12H is 10, and the capacitance of the capacitor C1 is 2.4 pF. In other words, in the multiplexer according to example A, the Q value ($Q_{C2}$) of the capacitance ($C_{C2}$) of the capacitor C2 is greater than the Q value ($Q_{12H}$) of the capacitance of the filter 12H and the capacitance ($C_{C2}$) of the capacitor C2 is greater than 3 pF.

Figure 9A:
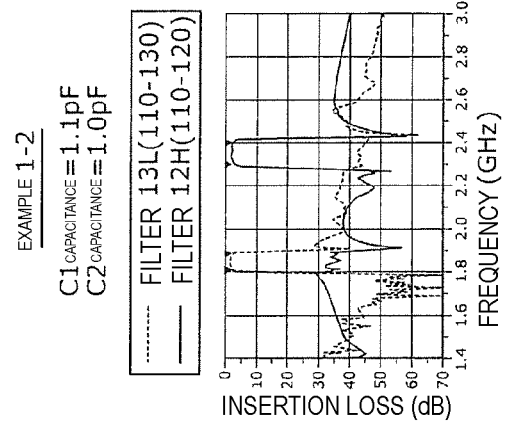
FIGS. 9A, 9B and 9C depict graphs for comparing bandpass characteristics when the capacitances of a first capacitor and a second capacitor in multiplexers according to example A and example 1 are varied.
Figure 9B:
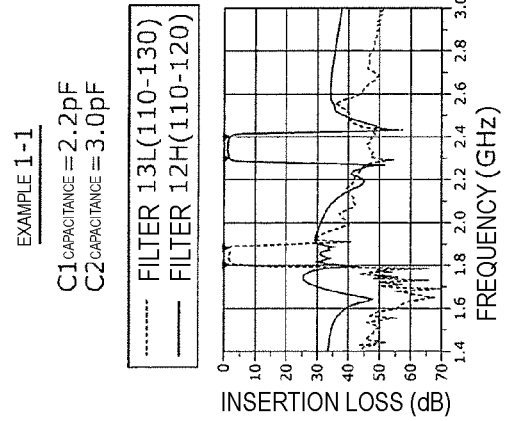
Figure 9C:
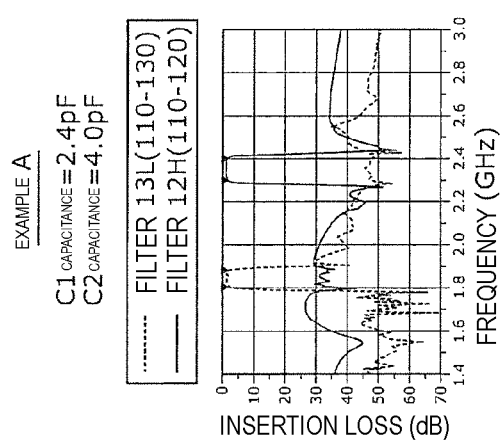

FIGS. 9A, 9B and 9C depict graphs for comparing bandpass characteristics when the capacitances of the capacitors C1 and C2 in the multiplexers according to example A and example 1 are varied. FIG. 9A illustrates the bandpass characteristic of the filter 13L (between common terminal 110 and input/output terminal 130) and the bandpass characteristic of the filter 12H (between common terminal 110 and input/output terminal 120) of the multiplexer according to example A. In addition, FIG. 9B illustrates the bandpass characteristic of the filter 13L and the bandpass characteristic of the filter 12H of the multiplexer according to example 1-1. Furthermore, FIG. 9C illustrates the bandpass characteristic of the filter 13L and the bandpass characteristic of the filter 12H of the multiplexer according to example 1-2.

As illustrated in FIGS. 9A, 9B and 9C, the insertion loss inside the pass band of the filter 13L decreases as the capacitance ($C_{C2}$) of the capacitor C2 decreases as 4.0 pF, 3.0 pF, and 1.0 pF. In particular, when the capacitance ($C_{C2}$) of the capacitor C2 is less than or equal to 3 pF (examples 1-1 and 1-2), the insertion loss inside the passband of the filter 13L is smaller than 2.5 dB and the low-loss multiplexer 1 is realized. The insertion loss required for the filters 13L and 12H (e.g., the insertion loss inside the pass bands of 2.5 dB or less) may vary depending on the required specifications of the communication device in which the multiplexer 1 is installed.

Embodiment 2

Embodiment 1 described a multiplexer having a configuration in which two filters are connected to a common terminal, whereas this embodiment will describe a multiplexer having a configuration in which three filters are connected to a common terminal.

Figure 10A:
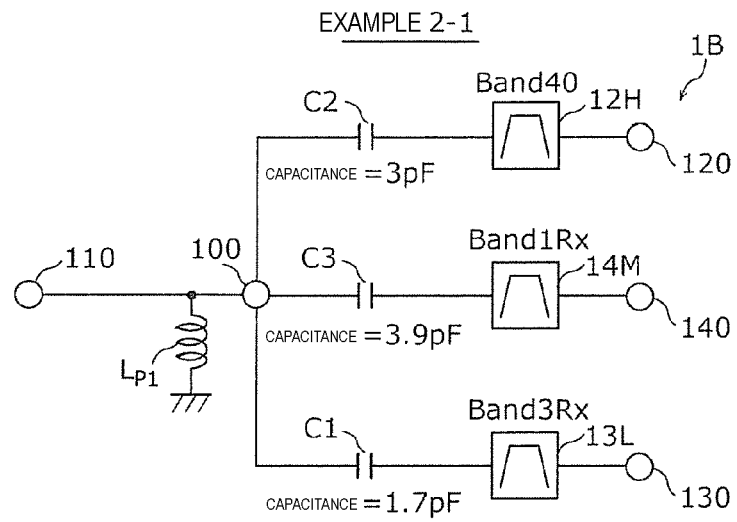
FIG. 10A is a circuit configuration diagram of a multiplexer according to example 2-1.

FIG. 10A is a circuit configuration diagram of a multiplexer 1B according to example 2-1. As illustrated in the figure, the multiplexer 1B includes filters 13L, 12H, and 14M, capacitors C1, C2, and C3, an inductor $L_{P1}$, common terminals 100 and 110, and input/output terminals 120, 130, and 140. The multiplexer 1B according to this example differs from the multiplexer 1A according to example 1 in that the filter 14M and the capacitor C3 have been added in the multiplexer 1B. Hereafter, the description will focus on the differences between the multiplexer 1B according to example 2-1 and the multiplexer 1A according to example 1.

The filter 14M is a third filter that is arranged between the common terminal 100 and the input/output terminal 140 (third input/output terminal) and has a third pass band (center frequency $f0_{14M}$). The third pass band is the reception band (2110-2170 MHz) of Band 1 of LTE, for example.

The capacitor C3 is a third capacitor that is serially arranged along a path connecting the common terminal 100 and the filter 14M to each other.

The Q value ($Q_{C2}$) of the capacitance of the capacitor C2 in the first pass band is 100. In addition, the capacitance ($C_{C2}$) of the capacitor C2 is 3 pF. The capacitance ($C_{C1}$) of the capacitor C1 is 1.7 pF. The capacitance ($C_{C3}$) of the capacitor C3 is 3.9 pF.

In addition, when the filter 12H is regarded as a capacitance, the Q value ($Q_{12H}$) of this capacitance in the first pass band is 10.

According to the above-described configuration of the multiplexer 1B in accordance with this modification, the capacitor C2, which has a higher Q value than the Q value of the capacitance of the filter 12H in the first pass band, is inserted between the filter 12H and the common terminal 100. Therefore, the Q value of the capacitance of the filter 12H in the first pass band can be increased on the common terminal 100 side of the filter 12H. Thus, the reflection coefficient (|Γ|) of the filter 12H in the first pass band can be increased (return loss can be reduced) and therefore insertion loss in the first pass band of the filter 13L, which is connected to the common terminal 100 together with the filter 12H, can be improved. In addition, propagation loss of a radio-frequency signal can be reduced without arranging a splitting/combining device, a phase adjusting circuit, or the like in a stage prior to the filters, and reductions in size and cost can be realized.

In the case where the frequency of spurious generated by the filter 12H overlaps the third pass band, the insertion loss in the third pass band of the filter 14M can be improved by setting the Q value of the capacitance of the capacitor C2 in the third pass band to be higher than the Q value of the capacitance of the filter 12H in the third pass band.

Figure 10B:
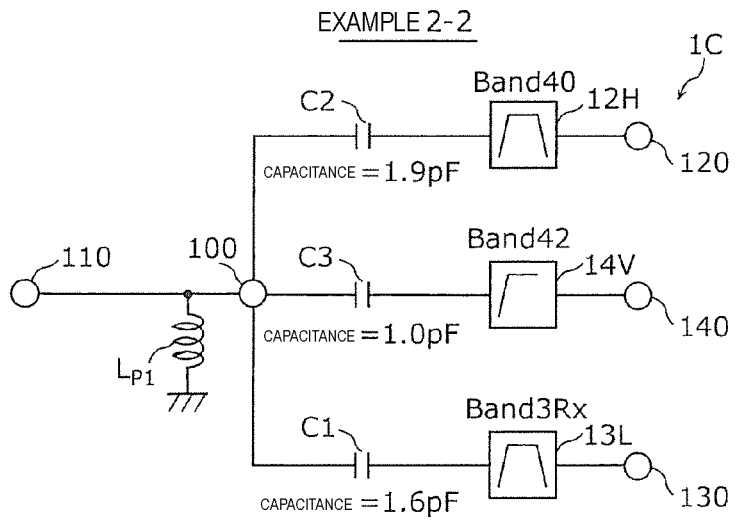
FIG. 10B is a circuit configuration diagram of a multiplexer according to example 2-2.

FIG. 10B is a circuit configuration diagram of a multiplexer 1C according to example 2-2. As illustrated in the figure, the multiplexer 1C includes filters 13L, 12H, and 14V, capacitors C1, C2, and C3, an inductor $L_{P1}$, common terminals 100 and 110, and input/output terminals 120, 130, and 140. The multiplexer 1C according to this example differs from the multiplexer 1B according to example 2-1 in that the pass band of the filter 14V is located at a higher frequency than the pass band of the filter 12H and in that the capacitances of the capacitors are different. Hereafter, the description will focus on the differences between the multiplexer 1C according to example 2-2 and the multiplexer 1B according to example 2-1.

The filter 14V is a third filter that is arranged between the common terminal 100 and the input/output terminal 140 (third input/output terminal) and has a third pass band (center frequency $f0_{14V}$). The third pass band is the transmission/reception band (3400-3600 MHz) of Band 42 of LTE, for example. In other words, the third pass band is located at a higher frequency than the first pass band and the second pass band. Thus, the filter 14V may be a high pass filter and in this case, the capacitor C3 may be a capacitor included in the high pass filter.

The capacitor C3 is a third capacitor that is serially arranged along a path connecting the common terminal 100 and the filter 14V to each other.

The capacitance Q value ($Q_{C2}$) of the capacitor C2 in the first pass band is 100. In addition, the capacitance ($C_{C2}$) of the capacitor C2 is 1.9 pF. The capacitance ($C_{C1}$) of the capacitor C1 is 1.6 pF. The capacitance ($C_{C3}$) of the capacitor C3 is 1.0 pF.

In addition, when the filter 12H is regarded as a capacitance, the Q value ($Q_{12H}$) of this capacitance in the first pass band is 10.

According to the above-described configuration of the multiplexer 1C in accordance with this modification, the capacitor C2, which has a higher Q value than the Q value of capacitance of the filter 12H in the first pass band, is inserted between the filter 12H and the common terminal 100. Therefore, the Q value of the capacitance of the filter 12H in the first pass band can be increased on the common terminal 100 side of the filter 12H. Thus, the reflection coefficient ($|\Gamma|$) of the filter 12H in the first pass band can be increased (return loss can be reduced) and therefore insertion loss in the first pass band of the filter 13L, which is connected to the common terminal 100 together with the filter 12H, can be improved. In addition, propagation loss of a radio-frequency signal can be reduced without arranging a splitting/combining device, a phase adjusting circuit, or the like in a stage prior to the filters, and reductions in size and cost can be realized.

In the multiplexer 1C according to this modification, since the capacitors C1, C2, and C3 are respectively arranged for all the filters 13L, 12H, and 14V, the following effects are realized.

That is, in the case where the frequency of spurious generated by the filter 14V overlaps the first pass band, the insertion loss in the first pass band of the filter 13L can be improved by setting the Q value of the capacitance of the capacitor C3 in the first pass band to be higher than the Q value of the capacitance of the filter 14V in the first pass band. In addition, in the case where the frequency of spurious generated by the filter 14V overlaps the second pass band, the insertion loss in the second pass band of the filter 12H can be improved by setting the Q value of the capacitance of the capacitor C3 in the second pass band to be higher than the Q value of the capacitance of the filter 14V in the second pass band.

Furthermore, in the case where spurious generated by the filter 13L is generated at a higher frequency than the first pass band and the frequency of the spurious overlaps the second pass band, the insertion loss in the second pass band of the filter 12H can be improved by setting the Q value of the capacitance of the capacitor C1 in the second pass band so as to be higher than the Q value of the capacitance of the filter 13L in the second pass band. In addition, in the case where spurious generated by the filter 13L is generated at a higher frequency than the first pass band and the frequency of the spurious overlaps the third pass band, the insertion loss in the third pass band of the filter 14V can be improved by setting the Q value of the capacitance of the capacitor C1 in the third pass band so as to be higher than the Q value of the capacitance of the filter 13L in the third pass band.

Furthermore, the capacitances of the capacitors C1 to C3 are less than or equal to 3 pF, and therefore the insertion losses in the pass bands of the filters 13L, 12H, and 14V can be further reduced.

Embodiment 3

The multiplexers according to embodiments 1 and 2 described above can also be applied to a radio-frequency front end circuit and to a communication device that includes such a radio-frequency front end circuit. Accordingly, such a radio-frequency front end circuit and such a communication device will be described in this embodiment.

Figure 11:
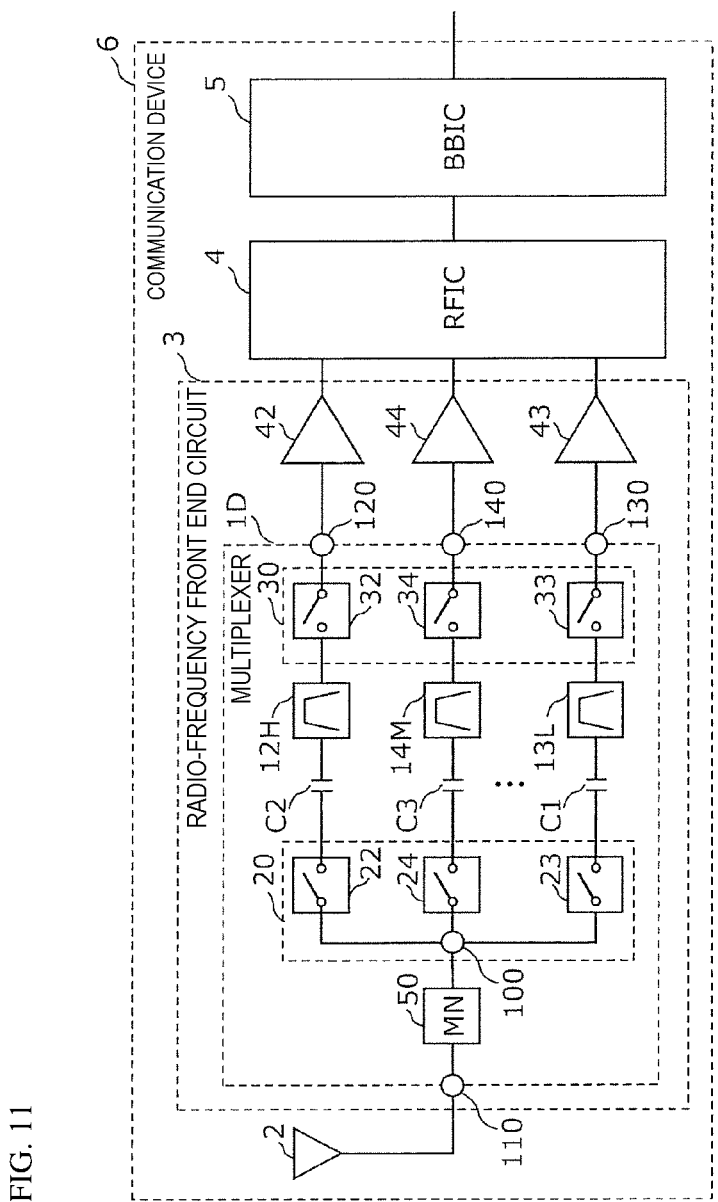
FIG. 11 is a circuit configuration diagram of a communication device according to embodiment 3.

FIG. 11 is a circuit configuration diagram of a radio-frequency front end circuit 3 and a communication device 6 according to embodiment 3. The communication device 6 is formed of an antenna element 2, the radio-frequency front end circuit 3, an RF signal processing circuit (RFIC) 4, and a baseband signal processing circuit (BBIC) 5. The communication device 6 does not have to include the antenna element 2.

The radio-frequency front end circuit 3 includes a multiplexer 1D and reception amplification circuits 42, 43, and 44.

The multiplexer 1D for example has a configuration obtained by adding switch circuits 20 and 30 to the multiplexer 1B according to example 2-1. More specifically, the switch circuit 20 is formed of switches 22, 23, and 24 and the switch circuit 30 is formed of switches 32, 33, and 34. The multiplexer 1D has an impedance matching network 50 arranged between the common terminals 100 and 110 instead of the inductor $L_{P1}$ arranged in the multiplexer 1B according to example 2-1.

The switch 22 is a single pole single throw (SPST) switch that is connected between the common terminal 100 and the capacitor C2 and switches the common terminal 100 and the capacitor C2 and the filter 12H between being connected to each other and disconnected from each other. The switch 24 is an SPST switch that is connected between the common terminal 100 and the capacitor C3 and switches the common terminal 100 and the capacitor C3 and the filter 14M between being connected to each other and disconnected from each other. The switch 23 is an SPST switch that is connected between the common terminal 100 and the capacitor C1 and switches the common terminal 100 and the capacitor C1 and the filter 13L between being connected to each other and disconnected from each other.

The switch 32 is an SPST switch that is connected between the input/output terminal 120 and the filter 12H and switches the input/output terminal 120 and the capacitor C2 and the filter 12H between being connected to each other and disconnected from each other. The switch 34 is an SPST switch that is connected between the input/output terminal 140 and the filter 14M and switches the input/output terminal 140 and the capacitor C3 and the filter 14M between being connected to each other and disconnected from each other. The switch 33 is an SPST switch that is connected between the input/output terminal 130 and the filter 13L and switches the input/output terminal 130 and the capacitor C1 and the filter 13L between being connected to each other and disconnected from each other.

The switch circuits 20 and 30 connect the common terminal 100 and a signal path corresponding to a prescribed band to each other in accordance with a control signal from a control unit (not illustrated). There may be more than one signal path connected to the common terminal 100. In other words, the radio-frequency front end circuit 3 may support carrier aggregation. In addition, the switch circuits 20 and 30 may be omitted.

The reception amplification circuit 42 amplifies a radio-frequency signal that has passed through the antenna element 2, the capacitor C2, and the filter 12H and outputs the amplified signal to the RF signal processing circuit 4. The reception amplification circuit 44 amplifies a radio-frequency signal that has passed through the antenna element 2, the capacitor C3, and the filter 14M and outputs the amplified signal to the RF signal processing circuit 4. The reception amplification circuit 43 amplifies a radio-frequency signal that has passed through the antenna element 2, the capacitor C1, and the filter 13L and outputs the amplified signal to the RF signal processing circuit 4.

The RF signal processing circuit 4 subjects a radio-frequency signal inputted thereto from the antenna element 2 via each signal path to signal processing using down conversion and so forth, and outputs a reception signal generated through this signal processing to the baseband signal processing circuit 5. The RF signal processing circuit 4 is an RFIC, for example.

A signal processed by the baseband signal processing circuit 5 is used for image display as an image signal or for a phone call as an audio signal, for example.

The radio-frequency front end circuit 3 may include other circuit elements between the above-described constituent elements.

As a result of the thus-configured radio-frequency front end circuit 3 and communication device 6 including the multiplexer according to embodiment 1 or 2, the reflection coefficient ($|\Gamma|$) of the filter 12H in the first pass band can be increased (return loss can be reduced) and therefore insertion loss in the first pass band of the filter 13L, which is connected to the common terminal 100 together with the filter 12H, can be improved. In addition, propagation loss of a radio-frequency signal can be reduced without arranging a splitting/combining device, a phase adjusting circuit, or the like in a stage prior to the filters, and reductions in size and cost can be realized.

The radio-frequency front end circuit 3 may include a triplexer or a quadplexer capable of handling both transmission and reception instead of the multiplexer according to embodiment 1 or 2.

In addition, depending on the radio-frequency signal processing method used, the communication device 6 may not need to include the baseband signal processing circuit (BBIC) 5.

(Other Modifications Etc.)

Multiplexers, a radio-frequency front end circuit, and a communication device according to embodiments of the present disclosure have been described above in the form of embodiments 1 to 3, but other embodiments realized by combining any of the constituent elements of the above-described embodiments with one another, modifications obtained by modifying the above-described embodiments in various ways, as thought of by a person skilled in the art, without departing from the gist of the present disclosure, and various devices having a radio-frequency front end circuit and a communication device according to the present disclosure built thereinto are also included in the present disclosure.

For example, in the multiplexers according to embodiments 1 and 2, each of the filters 12H, 13L, 14M, and 14V is applied to one of the following communication bands (1) to (7).

(1) Middle Band (MB: 1710-2200 MHz): Band 1, Band 2, Band 3, Band 4, Band 66, or Band 25 Communication Band (2) High Band (HB: 2300-2690 MHz): Band 7, Band 30, Band 38, Band 40, or Band 41 Communication Band (3) Ultra High Band (UHB: 3400-3800 MHz): Band 42 or Band 43 Communication Band (4) Communication Band Belonging to Low Band (LB: 699-960 MHz)

(5) L5 (1.2 GHz Band) GPS Band (6) 5G-NR (3.3-5.0 GHz): n77, n78, or n79 Communication Band (7) WiFi (5.0 GHz Band) Band For example, in the multiplexer 1B according to example 2-1, (4) may be used for the filter 13L, (5) may be used for the filter 14M, and any one of (1) to (3) may be used for the filter 12H. In addition, for example, in the multiplexer 1C according to example 2-2, any one of (1), (2), and (4) may be used for the filter 13L, (7) may be used for the filter 14V, and (6) may be used for the filter 12H.

For example, in the above-described disclosures, a two-branch splitting/combining circuit in which two reception signal paths are connected to a common terminal and a three-branch splitting/combining circuit in which three reception signal paths or transmission signal paths are connected to a common terminal have been described as examples of a multiplexer, but the present disclosure can also be applied to a circuit that includes both transmission paths and reception paths and a splitting/combining circuit in which four or more signal paths are connected to a common terminal, for example.

In other words, in a multiplexer in which (n) filters having center frequencies f1, f2, . . . , fn (n is a natural number greater than or equal to 2) are connected to a common terminal, in a second filter, which is at least one filter other than the filter having the lowest center frequency f1, a capacitor is serially arranged on a connection path (series arm) connected between the common terminal and the second filter. In this case, when the second filter is regarded as a capacitance, the Q value of the capacitor in the pass band of the first filter (first pass band) is higher than the Q value of the capacitance in the first pass band.

As a result, the reflection coefficient ($|\Gamma|$) of the second filter in the first pass band can be increased (return loss can be reduced), and therefore the insertion loss in the first pass band of the first filter, which is connected to the common terminal along with the second filter, can be improved. Therefore, propagation loss of a radio-frequency signal can be reduced without arranging a splitting/combining device, a phase adjusting circuit, or the like in a stage prior to the filters, and reductions in size and cost can be realized.

In addition, in the above-described embodiments, the meaning of "two or more filters are connected to a common terminal" includes not only a configuration in which two or more filters are directly connected to a common terminal but also includes a configuration in which two or more filters are indirectly connected to a common terminal using the following kinds of configuration. For example, a configuration may be adopted in which a branching circuit that enables one or more conductive paths to be realized such as a switch, a phase circuit or a power splitter (divider) is arranged between the common terminal and two or more filters.

In addition, in each filter of a multiplexer, additionally, an inductor or a capacitor may be connected between terminals such as an input/output terminal and a ground terminal or a circuit element other than an inductor or a capacitor such as a resistance element may be added.

The present disclosure can be widely used in communication devices such as cellular phones as a multiplexer, a radio-frequency front end circuit, and a communication device that can be applied to frequency standards that support multiple bands and multiple modes and that have low loss, are compact, and are low cost.

1, 1A, 1B, 1C, 1D multiplexer
2 antenna element
3 radio-frequency front end circuit
4 RF signal processing circuit (RFIC)
5 baseband signal processing circuit (BBIC)
6 communication device
10A, 10B acoustic wave filter
12H, 13L, 14M, 14V filter
20, 30 switch circuit
22, 23, 24, 32, 33, 34 switch
42, 43, 44 reception amplification circuit
50 impedance matching network
51, 52, 120, 130, 140 input/output terminal
60, 70 Si substrate
61, 71 lower electrode
62, 72 upper electrode
63, 73 piezoelectric thin film
64a, 64b, 64c capacitive electrode
74 high acoustic impedance film
75 low acoustic impedance film
80 substrate
90 mounting substrate
100, 110 common terminal
101, 102, 103, 104, 105, 201, 202, 203 series arm resonator
125, 215, 225 longitudinal coupling SAW resonator section
151, 152, 153, 154, 251 parallel arm resonator
220 longitudinal-coupling-type filter section
C1, C2, C3 capacitor
$L_{P1}$ inductor

The invention claimed is:

1. A multiplexer comprising:
a common terminal, a first input/output terminal, and a second input/output terminal;
a plurality of filters connected to the common terminal, wherein:
  a first filter is arranged between the common terminal and the first input/output terminal, the first filter having a first pass band; and
  a second filter is arranged between the common terminal and the second input/output terminal, the second filter including at least one acoustic wave resonator, and having a second pass band located at a higher frequency than the first pass band;
a first capacitor that is serially arranged on a connection path between the common terminal and the first filter; and
a second capacitor that is serially arranged on a connection path between the common terminal and the second filter,
wherein the at least one acoustic wave resonator of the second filter utilizes leaky waves that propagate along a piezoelectric substrate composed of LiTaO3 as surface acoustic waves or at least one acoustic wave resonator having a stacked structure comprising a high-acoustic-velocity support substrate, a low-acoustic-velocity film, and a piezoelectric layer,
wherein when the second filter is regarded as a capacitance, a Q value of the second capacitor in the first pass band is higher than a Q value of the capacitance in the first pass band, and
wherein a capacitance value of the second capacitor is lower than or equal to 3 pF.

2. The multiplexer according to claim 1, wherein:
the second filter comprises a substrate, a lower electrode, and an upper electrode.

3. The multiplexer according to claim 2, wherein:
the second capacitor comprises the upper electrode, a capacitive electrode, and a dielectric formed between the upper electrode and the capacitive electrode.

4. The multiplexer according to claim 3, wherein the capacitive electrode is arranged so as to face the upper electrode.

5. The multiplexer according to claim 2, wherein:
the second capacitor comprises the lower electrode, a capacitive electrode, and a dielectric arranged between the lower electrode and the capacitive electrode.

6. The multiplexer according to claim 5, wherein the capacitive electrode is arranged so as to face the lower electrode.

7. The multiplexer according to claim 2, wherein:
the second capacitor comprises one of the upper electrode or the lower electrode and an acoustic multilayer film electrode layer.

8. The multiplexer according to claim 1, further comprising:
a third input/output terminal;
a third filter that is arranged between the common terminal and the third input/output terminal and that has a third pass band; and
a third capacitor that is serially arranged on a connection path between the common terminal and the third filter.

9. The multiplexer according to claim 8, wherein a capacitance value of the first capacitor and a capacitance value of the third capacitor are each lower than or equal to 3 pF.

10. The multiplexer according to claim 9, wherein the third pass band is located at a higher frequency than the first pass band and the second pass band, and
the third filter is a high pass filter.

11. The multiplexer according to claim 8, wherein the third pass band is located at a higher frequency than the first pass band and the second pass band, and
the third filter is a high pass filter.

12. A radio-frequency front-end circuit comprising:
the multiplexer according to claim 1; and
an amplification circuit that is connected to the multiplexer.

13. The radio-frequency front-end circuit according to claim 12, further comprising:
an impedance matching network that is connected between the common terminal and a ground terminal.

14. A communication device comprising:
an RF signal processing circuit that processes a radio-frequency signal transmitted or received by an antenna element; and
the radio-frequency front end circuit according to claim 12, which transmits the radio-frequency signal between the antenna element and the RF signal processing circuit.

15. The multiplexer according to claim 1, wherein at least one of the first filter or the second filter comprises a plurality of series acoustic wave resonators serially connected between the first input/output terminal and the second input/output terminal, and a plurality of parallel arm acoustic wave resonators connected in parallel between ground and connection points between the plurality of series arm resonators.

16. The multiplexer according to claim 15, wherein at least one of the first filter or the second filter further comprises an inductor arranged between each of the plurality of parallel arm resonators and ground.

17. The multiplexer according to claim 1, further comprising:
    an inductor that is connected between the common terminal and a ground terminal.

18. The multiplexer according to claim 1, wherein the first filter includes at least one acoustic wave resonator.

* * * * *

UNITED STATES PATENT AND TRADEMARK OFFICE
CERTIFICATE OF CORRECTION

PATENT NO.       : 11,901,879 B2
APPLICATION NO.  : 17/117587
DATED            : February 13, 2024
INVENTOR(S)      : Hirotsugu Mori et al.

Page 1 of 1

It is certified that error appears in the above-identified patent and that said Letters Patent is hereby corrected as shown below:

In the Specification

Column 8, Line 36, "F" should be -- $|\Gamma|$ --.

Signed and Sealed this
Twenty-fourth Day of December, 2024

Derrick Brent
*Acting Director of the United States Patent and Trademark Office*